(12) United States Patent
Wang et al.

(10) Patent No.: US 6,366,499 B1
(45) Date of Patent: Apr. 2, 2002

(54) METHOD OF OPERATING FLASH MEMORY

(75) Inventors: Arthur Arthur Wang, Saratoga; Jein-Chen Young, Milpitas; Ming Kwan, San Leandro, all of CA (US)

(73) Assignee: Hyundai Electronics America, San Jose, CA (US)

( * ) Notice: Subject to any disclaimer, the term of this patent is extended or adjusted under 35 U.S.C. 154(b) by 0 days.

(21) Appl. No.: 09/689,026

(22) Filed: Oct. 10, 2000

Related U.S. Application Data

(62) Division of application No. 09/496,293, filed on Feb. 1, 2000, which is a continuation of application No. 08/863,918, filed on May 27, 1997.
(60) Provisional application No. 60/018,694, filed on May 30, 1996.

(51) Int. Cl.[7] ............................................... G11C 16/04
(52) U.S. Cl. .............................. 365/185.28; 365/185.18
(58) Field of Search ........................ 365/185.28, 285.18, 365/185.01

(56) References Cited

U.S. PATENT DOCUMENTS 5,457,652 A * 10/1995 Brahmbhatt ........... 365/185.06
5,487,033 A * 1/1996 Keeney et al. ......... 365/185.19
5,541,875 A * 7/1996 Liu et al. .................... 365/177
5,576,995 A * 11/1996 Sato et al. ............. 365/185.33

* cited by examiner

Primary Examiner—Hoai V. Ho
(74) Attorney, Agent, or Firm—Townsend and Townsend and Crew LLP

(57) ABSTRACT

A method of programming an electrically programmable memory cell which cell includes a transistor formed in a semiconductor substrate of first conductivity type having a surface a first well region of second conductivity type is disposed in the substrate adjacent the surface thereof. A second well region of first conductivity type is disposed in the first well region adjacent the surface. The transistor has a source region, a drain region, a floating gate, and a control gate. The method includes raising the control gate to a first selected potential no greater than 9.0 volts, raising the drain to a potential to no more than 5.0 volts, coupling the source region to ground potential, coupling the first well region of second conductivity type to ground potential, and placing the second well region at a potential below ground potential.

20 Claims, 12 Drawing Sheets

PROGRAM

METHOD OF OPERATING FLASH MEMORY

CROSS REFERENCE TO RELATED APPLICATION

The present application is a divisional of U.S. patent application No. 09/496,293, filed on Feb. 1, 2000, which is a continuation of and claims the benefit of U.S. patent application Ser. No. 08/863,918, filed on May 27, 1997 which in turn claims priority from U.S. Provisional Patent Application No. 60/018,694, filed on May, 30, 1996 all of which are incorporated by reference in their entirety for all purposes.

BACKGROUND OF THE INVENTION

This invention relates to integrated circuit nonvolatile memories, and in particular to flash memories. Flash memories are electrically-erasable nonvolatile memories in which groups of cells can be erased in a single operation.

Numerous types of integrated circuit memory are now well known, as are processes for manufacturing them. One particular type of integrated circuit memory is nonvolatile memory. Nonvolatile memory is referred to as such because it does not lose the information stored in the memory when power is removed from the memory. Nonvolatile memory has many applications in products where the supply of electricity is interruptable. For example, one well known product employing flash memory is PCMCIA or PC cards. PC cards are small credit card-sized packages which contain nonvolatile memory within which a computer program or other information is stored. Such devices allow the user to connect and disconnect the memory card from a computer or other electronic apparatus, without losing the program stored within the memory card.

Nonvolatile memory devices include read only memories (ROM), programmable read only memories (PROM), electrically-erasable read only memories (EEPROM), as well as other types. Within the field of electrically-erasable programmable memories, a certain class of devices is known as flash memory, or flash EEPROMs. Such memories are selectively programmable and erasable, typically with groups of cells being erasable in a single operation.

In conventional flash memories, each memory cell is formed from a transistor having a source, drain, control gate and floating gate. The floating gate is formed between the control gate and the substrate. The presence, or absence, of charge trapped on the floating gate can be used to indicate the contents of the memory cell. Charge trapped on the floating gate changes the threshold voltage of the transistor, enabling detection of its binary condition. FIG. 1A and FIG. 1B illustrate typical prior art flash memory cells.

In most flash memories, charge is placed on, or removed from, the floating gate by operating the memory at conditions outside its normal operating conditions for reading its contents. For example, by adjusting the relative potentials between the gate and the source, drain or channel regions, charge, in the form of electrons, can be caused to be injected onto the floating gate, or removed from the floating gate.

An unfortunate disadvantage of existing flash memory cells is that a high potential must be applied to the control gate to program the floating gate. For example, by placing a high positive voltage such as 8.5 volts on the control gate and grounding the source region, electrons will be pulled from the source onto the floating gate where they will be trapped. The negative charge on the floating gate then can be used to indicate the presence of a "one" or a "zero" in the memory cell. An unfortunate consequence of the requirement of using such a high potential for programming (or erase) is that the peripheral circuitry must be designed to also handle that high potential. In other words, all of the transistors and the accessing circuitry through which the 8.5 volts is applied, must itself be capable of handling the 8.5 volt potential. The high potential also generates leakage currents, and causes hot hole degradation. One such typical prior art NOR flash memory cell is described in U.S. Pat. No. 5,077,691 entitled "Flash EEPROM Array with Negative Gate Voltage Erase Operation."

As a result, it would be desirable to provide a flash memory which operates at a lower potential, minimizing these undesirable effects, and which provides improved performance.

SUMMARY OF THE INVENTION

This invention provides a flash memory cell having unique advantages over previous flash memory cells, together with a process for manufacturing such a cell and associated peripheral circuitry. The flash memory cell of this invention may be programmed and erased using substantially lower voltages than are employed in prior art flash memory cells. This provides advantages by enabling peripheral circuitry which supports the memory array and is on the same integrated circuit chip to be designed to handle lower voltages. This enables the use of smaller transistors, resulting in higher yields, greater reliability, and lower costs.

In a preferred embodiment, the flash memory cell structure of our invention includes a triple well integrated circuit structure. In particular, the memory cell includes a semiconductor substrate formed from first conductivity type material and having an upper surface. A first well region of second conductivity type extends into the substrate adjacent the surface, the second conductivity type being opposite to the first conductivity type. The first well includes within it a second well, also formed adjacent the surface of the substrate, and of first conductivity type material. A floating gate transistor is formed in the second well region, and includes a source region, a drain region, a floating gate disposed above the surface and electrically isolated from the substrate. The floating gate extends between the source and drain regions. A control gate is disposed above the floating gate. A first contact region is provided to the first well for controlling its potential, and a second contact region is provided to the second well for controlling its potential. As will be described, the use of multiple wells enables the memory cell to be programmed and erased with lower voltages than previously possible. It also minimizes the need for the peripheral circuitry to handle high potentials. The peripheral circuitry can be formed at any desired location depending on the properties desired, including in the first well, in the second well, or in the substrate outside both wells.

The invention also includes a process for fabricating an integrated circuit memory cell. In the preferred embodiment of the process, a semiconductor substrate of first conductivity type is employed. A first well region of second conductivity opposite to the conductivity of the first conductivity type is formed in the substrate and has a periphery. Within the periphery of the first well region, but also adjacent the surface of the substrate, a second well region is formed. Preferably, the second well region is of first conductivity type. Also formed within the periphery of the first well region is a first contact region which is spaced apart from the second well region. The first contact region is of second conductivity type and is more conductive than the first well region. A first insulating layer is formed across the surface of the substrate, and a conductive layer is formed on the insulating layer to provide a floating gate which is disposed above the surface of the substrate and electrically isolated therefrom. On the surface of the first conductive layer, a second insulating layer is formed. Over the second insulating layer a second conductive layer is formed which provides a control gate. Using the control gate and the floating gate as a mask, dopants are introduced into the second well region to form a source region, and a drain region. During this process a contact region is also formed to contact the second well. The contact region is spaced apart from the source region and the drain region, and is more conductive than the second well.

The invention also includes a unique technique for programming memory cells. In a preferred embodiment, the memory cells are programmed by raising the control gate to a first potential no greater than 9.0 volts. The drain is raised to a potential no more than 5.0 volts. The source is coupled to ground potential, and the region of semiconductor material within which the source and drain are formed is placed at a potential below ground potential. In response to this condition, electrons are caused to move from the substrate channel through the insulating layer and onto the floating gate. Their presence (or absence) on the floating gate can be used to indicate the state of the memory cell.

The invention also includes a technique for erasing memory cells. Memory cells formed according to the invention may be erased by lowering the potential of the control gate to a potential no more negative than −9.0 volts. The source and drain regions are disconnected from any potential source, and the semiconductor material within which the source and drain regions are formed is then placed at a potential no more positive than 8.0 volts. In response to this condition, any electrons trapped on the floating gate will be caused to tunnel through the intervening oxide over the channel and return to the substrate. As a result, the memory cell will be erased.

A particular advantage to the triple well flash memory of this invention is that a uniform erase may be performed instead of a nonuniform (source edge) erase. The uniform erase provides better endurance and data retention. The uniform erase is advantageous because the electrons tunnel through an insulating layer, eliminating the hot hole injection problems due to band-to-band tunneling and source edge erase which were problems of prior art devices. Hot hole degradation involves holes being trapped in the insulating oxide between the gate and source region. This results in leakage current and changes the erase characteristics.

An additional advantage of the triple well structure is that it allows independent control of the memory cell region substrate potential in contrast to the peripheral circuit substrate potential. In other words, the potential of the substrate in the region of the memory cells can be controlled independently of the potential of the substrate in the peripheral circuit regions. In contrast to prior art devices and processes, this enables the application of positive or negative voltage to the cell substrate, while simultaneously maintaining ground potential in the region of the peripheral devices. Such an approach allows for the uniform channel erase and the use of lower potentials.

In prior art flash memories, currents on the order of 20–30 milliamps were required to erase a block, and the use of channel erase was not feasible because the difference in potential between the substrate and the control gates could not be made large enough. Utilizing the techniques described here, erase currents for a block of cells can be reduced to on the order of 100 microamps. The low power and low current requirements of this invention make its applicability to battery-powered devices particularly advantageous.

BRIEF DESCRIPTION OF THE DRAWINGS

FIG. 3 illustrates the structure after implantation of the N-well;

FIG. 4 illustrates the structure after implantation of the P-well;

FIG. 5 illustrates the structure after annealing the P- and N-wells and forming a mask;

FIG. 6 illustrates the structure after formation of field oxide regions;

FIG. 7 illustrates the structure after implantation of the N-channel field;

FIG. 8 illustrates the structure after the N-channel threshold adjustment implant;

FIG. 9 illustrates the structure after the P-channel threshold implant;

FIG. 10 illustrates the structure after formation of gate oxide;

FIG. 11 illustrates the structure after the cell implant;

FIG. 12 illustrates the structure after removal of the gate oxide layer in a selected region;

FIG. 13 illustrates the structure after formation of the first layer of polycrystalline silicon;

FIG. 14 illustrates the structure after masking and etching the first layer of polycrystalline silicon;

FIG. 15 illustrates the structure after formation of the ONO insulating layers;

FIG. 16 illustrates the structure after formation of new gate oxide in a chosen location;

FIG. 17 illustrates the structure after formation of the second layer of polycrystalline silicon;

FIG. 18 illustrates the structure after formation of a mask;

FIG. 19 illustrates the structure after etching the second layer of polycrystalline silicon and forming a new mask;

FIG. 20 illustrates the structure after further etching is completed;

FIG. 21 illustrates the structure after implantation of memory cell source regions;

FIG. 22 illustrates the structure after implantation of memory cell drain regions;

FIG. 23 illustrates the structure after P type source drain implantation of some peripheral transistors;

FIG. 24 illustrates the structure after N type source drain implantation of other peripheral transistors;

FIG. 25 illustrates the structure after further P type source drain implantation of still other peripheral transistors;

FIG. 26 illustrates the structure after annealing and deposition of BPSG;

FIG. 27 illustrates the structure after formation of a contact mask;

FIG. 28 illustrates the structure after deposition of the first layer of metal;

FIG. 29 illustrates the structure after formation of a second contact mask;

FIG. 30 illustrates the structure after deposition of second metal; and

FIG. 31 illustrates the structure after deposition of a passivation layer.

DESCRIPTION OF THE SPECIFIC EMBODIMENTS

Figure 1A:
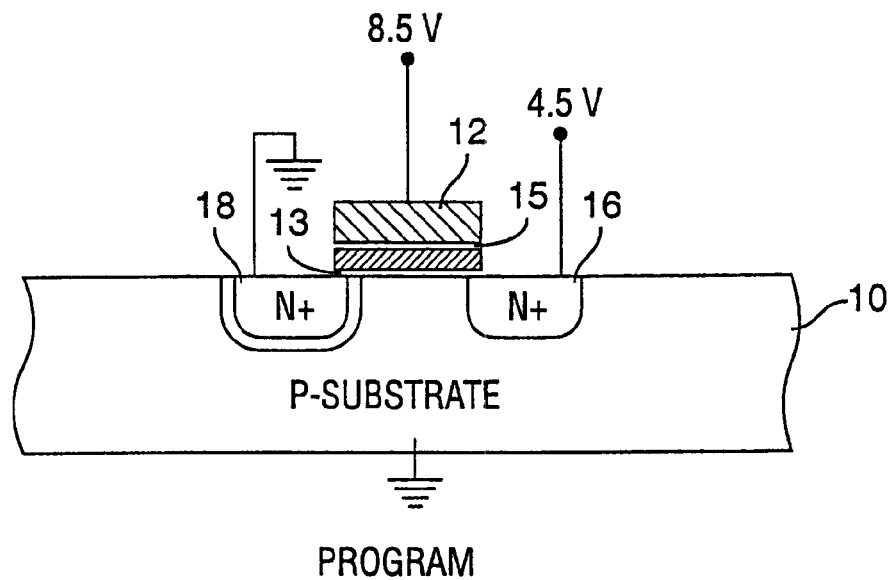
FIGS. 1A and 1B illustrate a prior art flash memory cell.
Figure 1B:
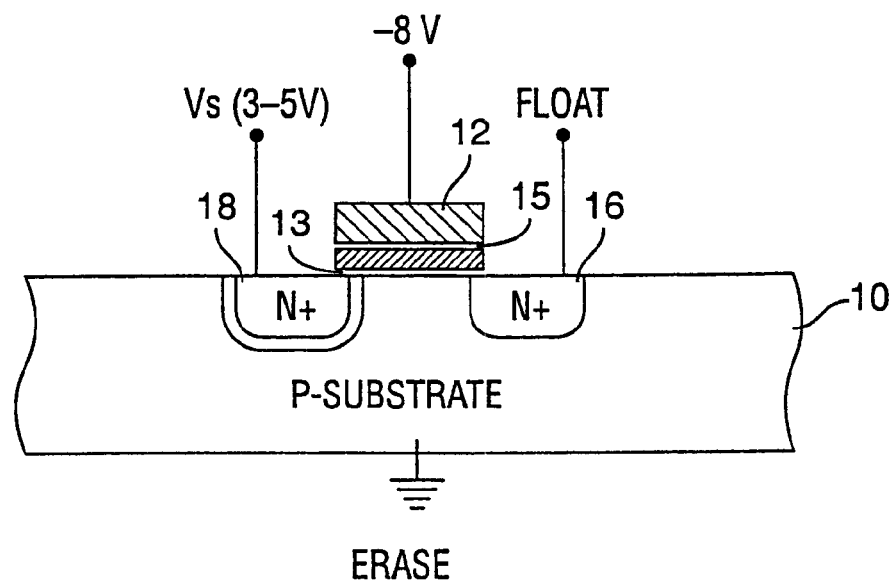

FIG. 1 illustrates a prior art flash memory cell in program (FIG. 1A) and erase (FIG. 1B) modes. The flash memory cell depicted includes a substrate 10, typically monocrystalline silicon, a double-diffused source region 18, and a drain region 16. Spaced above the substrate by a thin insulating layer 13 is a floating gate 15. Above the floating gate, and electrically isolated from it, is a control gate 12. Typically, the flash memory cells shown will provide a single bit in a much larger memory, for example, an integrated circuit chip with millions of bits of flash memory. The individual transistors on the integrated circuit are organized in a matrix, with orthogonally arranged bit lines and word lines. Typically, the drain region 16 will be connected to a bit line, while the control gate 12 is connected to a word line. In this way matrix addressing is provided.

The flash memory cells shown in FIGS. 1A and 1B can be operated in several different modes—program, erase, and read. The operating conditions for each mode are discussed below.

In the program mode of prior art devices, a high potential, preferably +8.5 volts, is placed on the control gate 12 for the selected word line. Nonselected word lines remain at ground. The selected bit line is placed about +4.5 volts, and this bit line is coupled to drain 16. The source region 18 is grounded. The result of these conditions is that hot electrons produced by channel current are attracted by the +8.5 volt potential on the control gate and tunnel through the thin oxide between the floating gate 15 and the channel region 18. Once on the floating gate, they are trapped, and charge the floating gate negatively. The negative charge changes the threshold voltage of the transistor. In this manner, the memory cell is programmed.

To read the prior art memory cell, a potential, typically Vcc of about +5 volts, is applied to the selected word line, while about 1 volt is applied to the selected bit line. The presence, or absence, of electrons on the floating gate makes the transistor harder, or easier, to turn on. By sensing whether the bit line changes potential, the state of the floating gate can be detected.

In erase mode as shown in FIG. 1B, a large negative voltage, usually −8.5 volts, is applied to the control gate of a group of selected devices to be erased. The bit line is allowed to float, while the source is held at an intermediate positive voltage, for example 3 to 5 volts. The combined negative potential on the control gate with the positive potential on the source, moves the electrons off the floating gate and back into the substrate through the source region, thereby discharging the floating gate and erasing the cells.

Figure 2A:
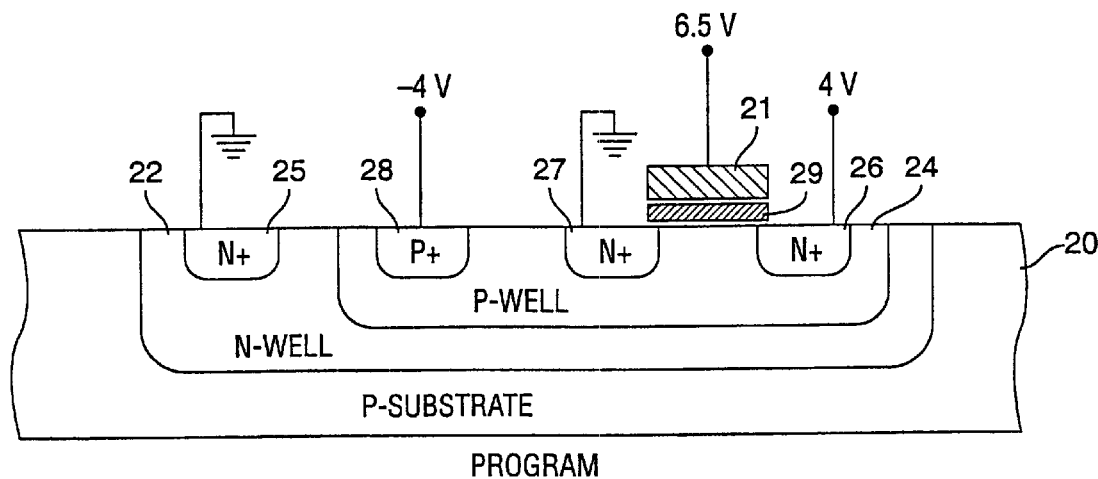
FIGS. 2A and 2B illustrate a preferred embodiment of the flash memory cell of this invention.
Figure 2B:
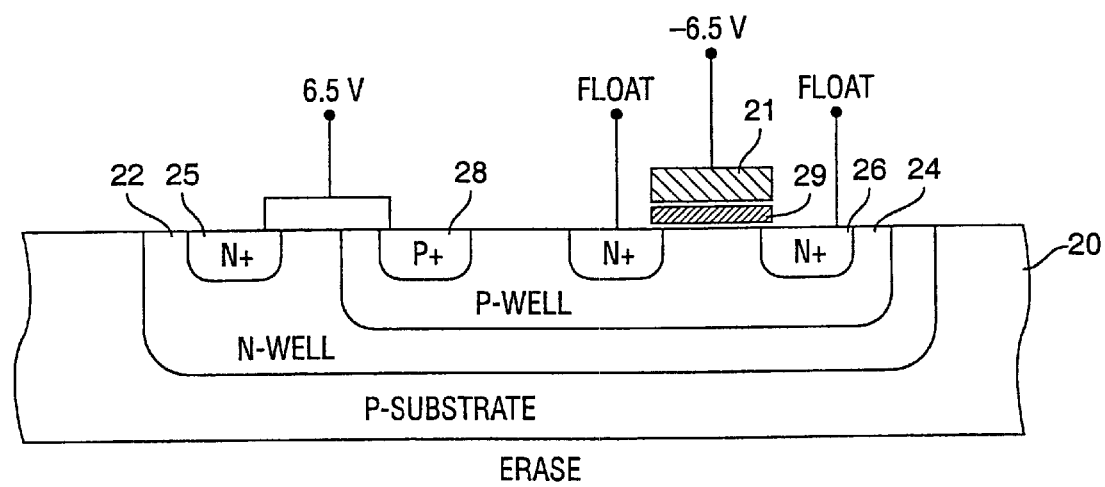

FIGS. 2A and 2B illustrate cross-sectional views of a flash memory cell according to a preferred embodiment of this invention. The same cell is illustrated in FIGS. 2A and 2B, with FIG. 2A showing the conditions for programming and FIG. 2B the conditions for erase.

In FIG. 2A a flash memory cell is fabricated in a preferably silicon substrate 20. The substrate is P conductivity type silicon, and an N conductivity type silicon well 22 is formed in the P substrate 20. (The process for manufacturing the structure shown in FIGS. 2A and 2B will be described below.) N-well 22 contains the depicted flash memory cell, and typically will be large enough to contain hundreds or thousands of such cells. Usually, at least as many cells will be formed in the N-well 22 as are desired to be erased in a block erase operation. Within N-well 22, a P conductivity type well 24 is formed. The source 27 and drain 26 are formed in the P-well, together with an additional doped region 28 to provide electrical contact to the P-well 24. The floating gate 29, and control gate 21 are also shown. A contact 25 to the N-well is provided to enable biasing the N-well 22.

For programming the cell, in the preferred embodiment the control gate 21 is held at a potential no greater than +9.0 volts, and preferably +6.5 volts, while the drain 26 is connected to a positive supply of +5.0 volts or less, preferably +4 volts. The source 27 is grounded, as is the N-well contact 25. P contact 28 to the P-well is held at a negative potential, typically −4 volts.

The conditions depicted create a field-enhanced channel hot electron effect by which the negative voltage on the P-well and the positive voltage on the control gate cause electrons to tunnel onto the floating gate 29 through the gate oxide over the channel. This places a negative charge on the floating gate. Note that in comparison to the prior art circuit shown in FIG. 1, significantly lower programming potentials are required. This reduces the need for higher capability peripheral circuits, lowers operating potentials and reduces power consumption.

After programming, the cell shown in FIG. 2A may be read by applying a positive potential, typically Vcc or +5 volts, to control gate 21, and a 1-volt signal to the bit line 26. The nonselected word lines are held at ground, while the nonselected bit lines are allowed to float. The presence, or absence, of electrons on floating gate 29 makes the transistor harder, or easier, to turn on, and this condition is detected by the bit line connected to the drain 26. If the transistor turns on, the bit line is discharged to ground. The state of the bit line is then interpreted as a "one" or a "zero."

The device illustrated may be erased using the conditions shown in FIG. 2B. As shown there, to erase the cell the control gate is placed at a lower potential no more negative than −9.0 volts, preferably −6.5 volts, while the P-well 24 and the N-well 22 are taken to a positive potential no more positive than +8.0 volts, but preferably +6.5 volts. The positive potential on the wells, coupled with the negative potential on the control gate, causes electrons on the floating gate to be attracted back into the substrate through the gate oxide, thereby erasing the device. Again, note that significantly lower potentials are being applied to the device shown in FIG. 2B than to the device shown in FIG. 1B.

Table 1 below summarizes the read, erase, and programming conditions for the triple well cell illustrated in FIGS. 2A and 2B. Program verify, erase-2, and program-2 modes are also shown. These are described below, however, essentially erase-2 and program-2 provide source side erase and program functions, while the erase and program functions discussed above provide channel erase and program functions.

Typical Operating Potentials (volts)

TABLE 1

|  | Read | Erase | Program | Program Verify | Erase-2 | Program-2 |
|---|---|---|---|---|---|---|
| Word-line (selected) | Vcc (+5) | −3.0 ~ −9.0 (−6.5) | +5.0 ~ +9.5 (+6.5) | +5.0 | −5.0 ~ −9.0 (−6.5) | +5.0 |
| Word-line (unselected) | 0 | 0 | 0 | 0 | 0 | 0 |
| Bit-line (selected) | +1.0 | F | +3.0 ~ +5.0 (+4.0) | +1.0 | F | +1.0 |
| Bit-line (unselected) | F | F | F | F | F | F |
| Source | 0 | F | 0 | 0 | +3.0 ~ +6.5 | −4.0 |
| N-well | 0 | +3.0 ~ +9.0 (+6.5) | 0 | 0 | +2.0 ~ +6.0 | 0 |
| P-well | 0 | +3.0 ~ +9.0 (+6.5) | −2.0 ~ −4.0 (−4.0) | 0 | +2.0 ~ +6.0 | −4.0 |

Note: In the table above, prefered operating conditions are shown in parenthesis.

In an alternative embodiment of the invention, a constant electrical field between floating gate 29 and P-well 24 is maintained during erase by applying a ramped voltage or stepped voltage on either the gate or the P-well, or both. For example, the P-well voltage can be ramped or stepped from +3 to +7 volts, and/or the voltage on the gate can be ramped from −5 to −9 volts. Such a technique has the advantage of enabling slow-to-erase bits to be erased at the same time as faster erasing bits. This helps tighten up the erase time distribution, and at the same time reduces the stress of erasing which causes induced leakage currents. It has the further advantage of removing a required erase verification operation.

An additional erase operation, termed "erase-2" herein, enables source edge erase with a P-well voltage to suppress band-to-band. tunneling current. It also reduces window closing. Such an erase operation reduces the power consumption during erase, and improves the endurance of the device by reducing hot holes generated at the edge of the source-gate region. A similar programming operation is referred to as "program-2."

FIGS. 3–31 illustrate a preferred embodiment of the process for manufacturing a flash memory cell according to this invention. To fully illustrate the invention, the process shown in the figures, and discussed below, includes the formation of five different types of transistors. Across the upper portion of FIG. 3, and a later figure as well, is shown the different types of transistors which will be formed by the process of the invention. In particular, the process of the invention enables the fabrication of flash memory cells, together with peripheral CMOS circuitry, of both P-channel and N-channel type. Of course, in the implementation of a particular flash memory product, the need for both P- and N-channel type transistors may not be present; however, both types are illustrated in the figures for completeness.

As shown across the upper portion of FIG. 3, in the left-hand portion of each of the figures from FIG. 3 to FIG. 31 will be described the steps necessary to form a thin oxide N-channel transistor. N-channel transistors such as this one will operate at voltages on the order of +5 volts. Immediately adjacent the thin oxide N-channel fabrication process is described the process for fabrication of a thick oxide N-channel device. Thick oxide N-channel devices will be used in the peripheral circuitry for higher voltage applications. For example, such devices typically will be used to handle the programming and erase modes where potentials on the order of up to +9 volts will be applied.

In the center of each of the figures, the process for forming a flash memory cell is described. As discussed above, this flash memory cell is formed in a triple well structure in which an N-well is formed in a P substrate, and the memory cell is formed in a P-well wholly within the N-well. Of course if desired, but at cross sections not shown in the figures, N-channel devices can also be formed in the P-well. These N-channel devices, unlike the memory cells, will not include a floating gate.

Immediately adjacent the memory cell in the illustrations is described the process for forming a thin oxide P-channel transistor. Such devices will be used in the peripheral circuitry for handling lower potentials, for example, up to about +5 volts. Adjacent them in the figures is described the process for forming thick oxide P-channel transistors. These transistors operate at higher potentials than the thinner oxide P-channel devices formed adjacent them. As with the thick oxide N-channel devices, the thick oxide P-channel devices will be used for circuitry for generating and distributing the higher potentials needed for programming and erase of the flash memory cells.

Figure 3:
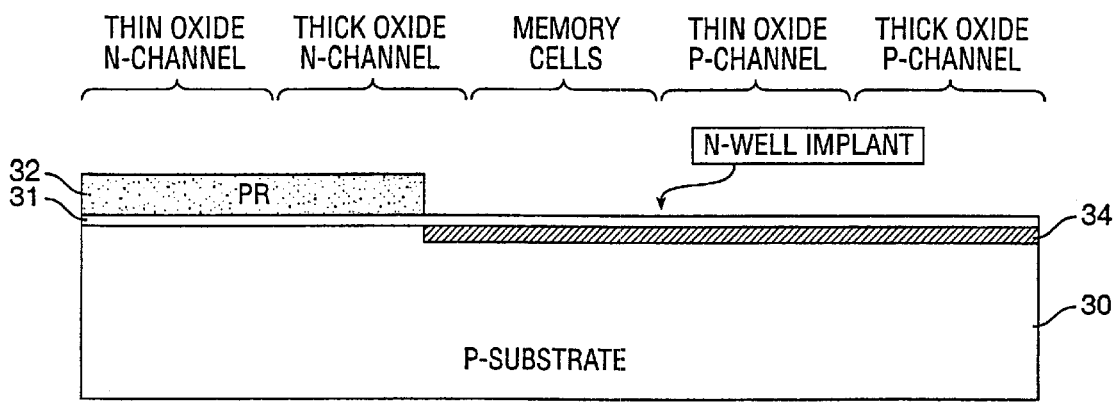
FIGS. 3–31 illustrate a preferred embodiment of a method for manufacturing the flash memory cell of this invention, with the specific figures as follows.

In FIG. 3 a P conductivity silicon substrate, preferably of 8–10 ohm centimeter resistivity, and of crystal orientation <100> is provided. Using conventional processes, the substrate is oxidized to provide a thin layer of silicon dioxide 31. On the upper surface of silicon dioxide 31 a mask 32 is formed, preferably of photoresist. Using well known techniques, the mask is exposed and developed to remove it from regions where the N-well 22 (see FIG. 2A) is desired. Next, again using well known technology, N conductivity type impurity, for example phosphorus, is implanted into the surface of the silicon to dope the N-well. Preferably the implantation is carried out with an energy of 2.2 mev and an impurity concentration of 6 E 12 $cm^{-2}$. At the conclusion of the implantation, the appearance of the structure is as shown in FIG. 3. FIG. 3 has been labeled with designations for the general locations where peripheral circuitry transistors and memory cells (flash) will be formed. In most integrated circuits the majority of the surface will consist of memory cells.

Figure 4:
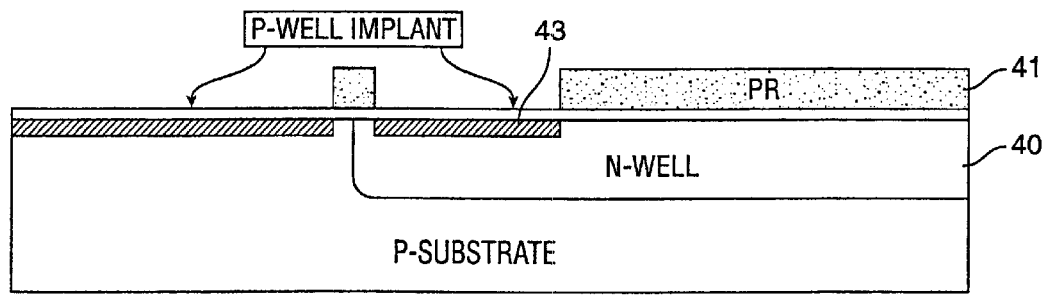

Next, as shown in FIG. 4, the photoresist 32 is removed, and an annealing process is performed to drive in the N-well dopant and create N-well 40. A new layer of photoresist 41 is applied to the upper surface of the integrated circuit, then masked and developed to expose regions where a P-well is desired. A P-well implant is then performed, for example, using boron or other P conductivity type impurity at a concentration of 1.5 E 13 $cm^{-2}$ and an energy of 100 kev.

The N-well will encompass the memory cell region of the chip. It can encompass as few or as many of the memory cells as desired, with other groups of memory cells being formed in other N-wells. The use of the N-well allows erasing of small blocks, for example, a single word line, and makes the choice of block size for the erase block to be arbitrary. This is a result of the lower potentials required by the triple well process in comparison to prior art source side erase. In prior art devices an erase block size was defined by current limitations. Large decoding transistors were needed to handle the high power used, and these consumed excessive chip area. In this invention the use of the N-well eliminates the need for large decoding transistors and enables arbitrary groups of cells to be erased simultaneously. As mentioned above, in addition, the erase can be made more uniform by virtue of the use of channel erase. FIG. 4 illustrates the appearance of the structure after the implantation of the P type impurities.

Figure 5:
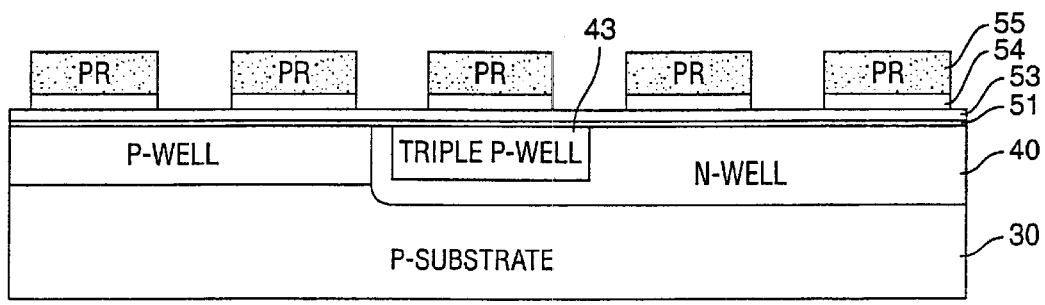

Photoresist 41 is removed, and as shown in FIG. 5, the P-well dopant is driven in using a thermal annealing process. All of the silicon dioxide on the upper surface is stripped, for example using an acid dip or plasma etching process. A new layer of silicon dioxide 51 is then formed across the upper surface of the integrated circuit, for example using a thermal process, to create 200 Angstroms of silicon dioxide. On the upper surface of silicon dioxide 51 a layer of polycrystalline silicon 53 is formed, preferably to a thickness of about 400 Angstroms using well known techniques, for example, chemical vapor deposition. The function of the polysilicon layer 53 is to serve as a stress release layer. On top of the polycrystalline silicon layer 53 a layer of silicon nitride 54 is deposited, again using chemical vapor deposition, typically to a thickness of about 2000 Angstroms. On top of the silicon nitride 54 another layer of photoresist 55 is deposited. Layer 55 is then exposed and developed, again using well known techniques. The photoresist is removed wherever field oxide regions are desired. Plasma or reactive ion etching is then performed to remove the regions of silicon nitride 54 exposed between the islands of photoresist 55. Such etching is well known in the art. The appearance of the structure at this stage in the process is as depicted in FIG. 5.

Figure 6:
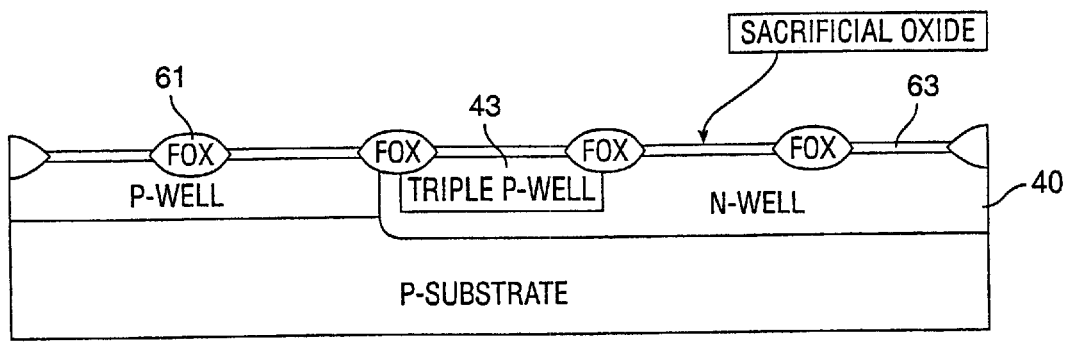

The next steps of the process are discussed in conjunction with FIG. 6. As shown there, the photoresist is removed from the upper surface of the structure, and an oxidation, typically at high temperature, is performed to create field oxide regions 61, referred to as FOX in the figures. Field oxide regions 61 function to isolate electrically various portions of the integrated circuit from each other. In a preferred embodiment, the field oxide is 0.5 microns thick, and is formed by heating the substrate to a temperature of 1150° C. for 300 minutes. Field oxide regions such as regions 61 are well known in the art.

After formation of the field oxide regions, the nitride layer is stripped from the surface of the structure, for example using a dip in a hot $H_2PO_4$ solution (phosphoric acid). Then the underlying polycrystalline silicon is removed, as well as the silicon dioxide layer 51 beneath the polycrystalline silicon. A new layer of silicon dioxide 63 is then formed across the upper surface of the structure, preferably by heating the silicon. Because it will be removed later, oxide 63 is referred to as sacrificial. The appearance of the structure after formation of sacrificial oxide 63 is shown in FIG. 6.

Figure 7:
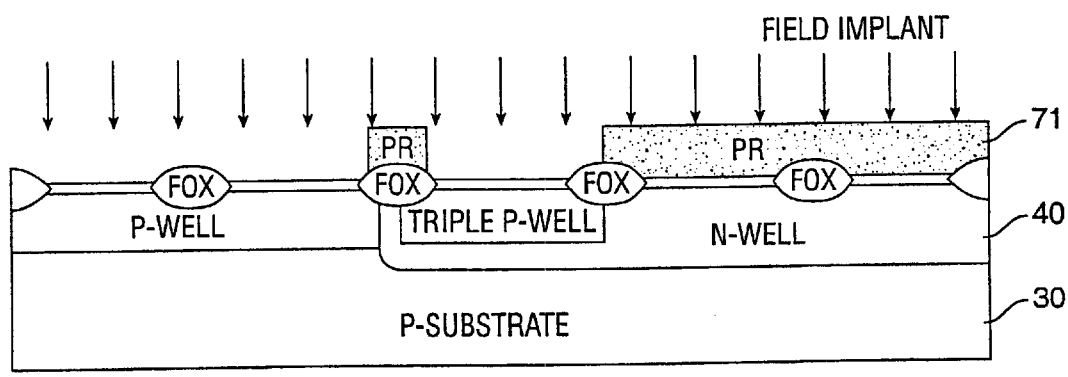

A layer of photoresist 71 is next formed across the upper surface of the structure, then masked and developed to expose the regions where a field implant is desired. The field implant will be introduced into the P-type regions. This N-channel field implant is a deep implant in regions where active N-channel devices will later be formed. This is shown in FIG. 7. Preferably, the N-channel implant will be introduced using an energy of 165 kev and a concentration of 5 E 12 $cm^{-2}$ of boron impurity.

Figure 8:
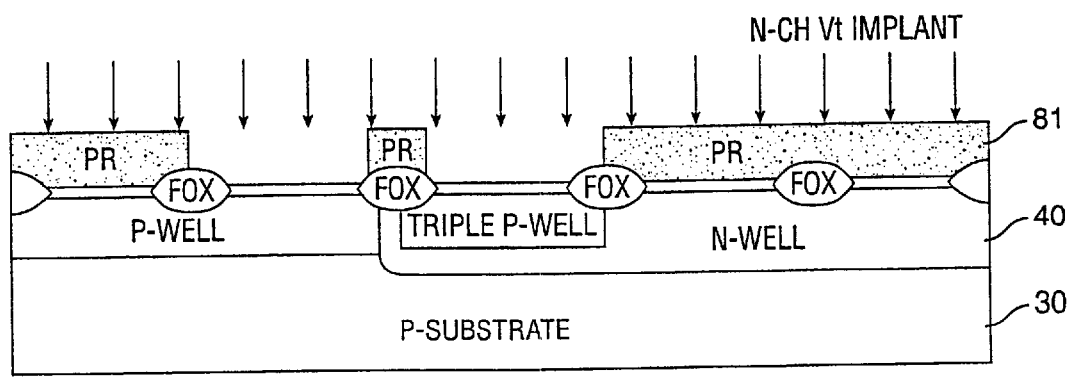

FIG. 8 illustrates the next steps of the process. As shown there a new photoresist masking layer 81 is formed across desired regions of the surface of the integrated circuit, again using well known photolithographic technology. The photoresist is removed from at least areas where memory cells will later be formed, and a threshold voltage adjusting implant is then performed in those regions.

Figure 9:
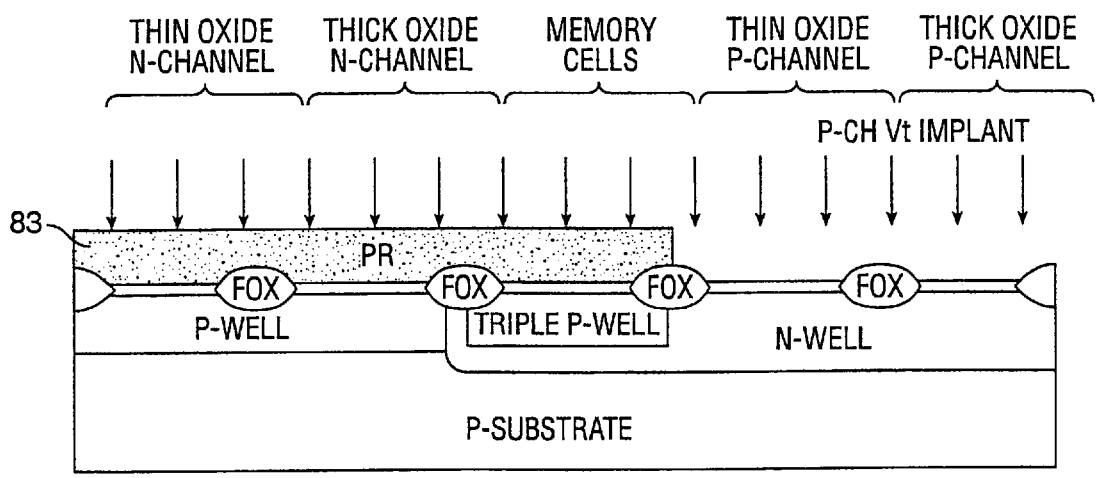

As shown by FIG. 9, a new mask 83 is formed and a P-channel threshold voltage implant performed to adjust those peripheral transistors. Then the photoresist is removed, and an etching operation is next performed to remove the sacrificial oxide from the surface of the exposed portions of the integrated circuit.

Figure 10:
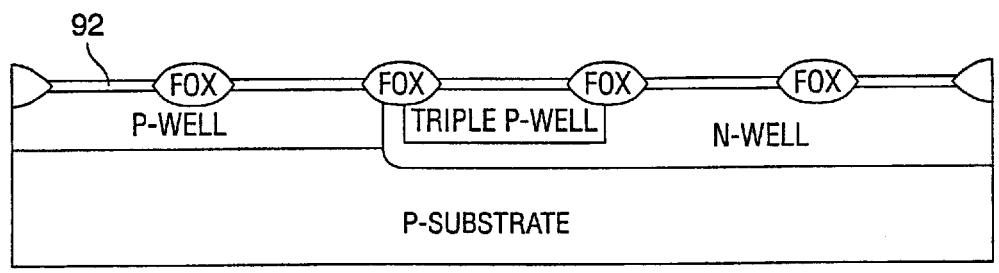
Figure 11:
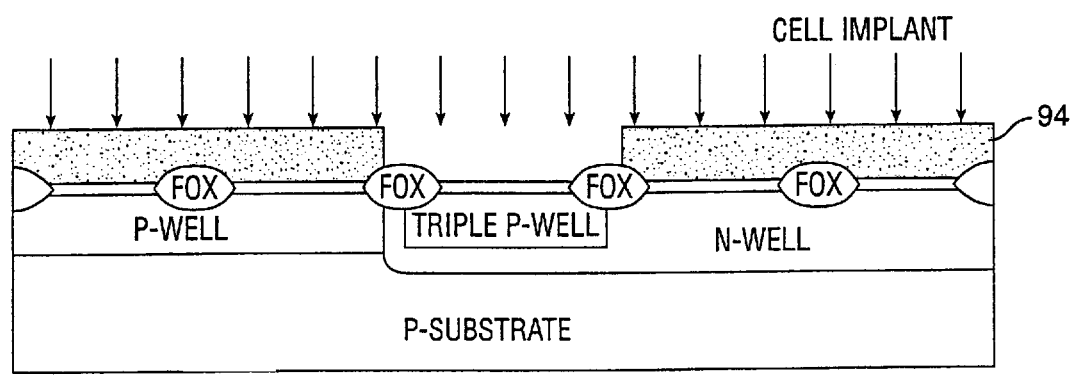
Figure 12:
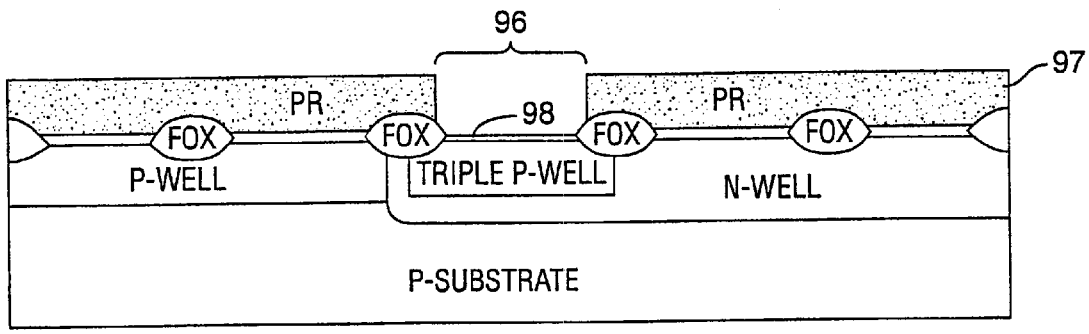
Figure 13:
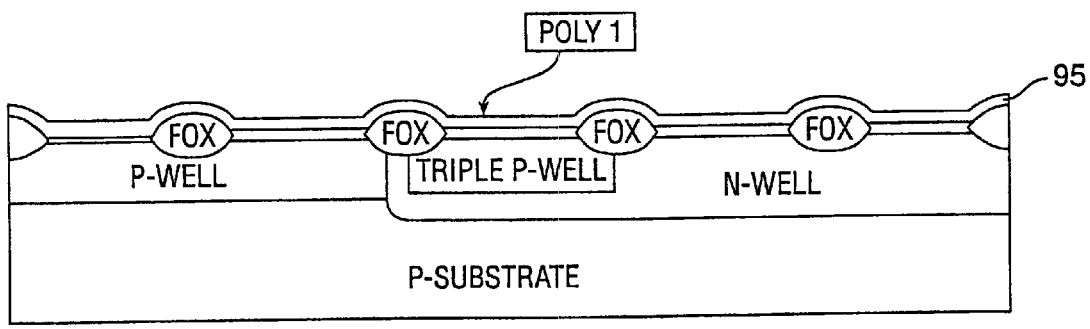

As shown by FIG. 10, a new layer of silicon dioxide 92 is formed over the structure. This new layer provides the thick gate oxide for the thick oxide P- and N-channel transistors in the peripheral circuitry. As shown in FIG. 11, a new photoresist mask 94 is applied to expose those regions 96 where the memory cell threshold voltage implant is to occur. The cell implant, P-type impurity, preferably boron, is introduced using a dose of 3 E 13 $cm^{-2}$ and an energy of 40 kev.

After cell implant, the same mask 94 is used to remove thick gate oxide 92. The exposed silicon dioxide is then etched (see FIG. 12), and new gate oxide 98 formed, again using well known techniques. This new layer 98 will provide the tunnel oxide through which the electrons tunnel during programming and erase of the memory cells. Preferably, the tunneling oxide 98 is 85 Angstroms thick, and is formed by heating the structure to a temperature of 850° C. for 45 minutes in steam and annealing at 900° C. for 30 minutes in $N_2$.

After formation of the oxide 98, a layer of polycrystalline silicon 95 is deposited across the upper surface of the structure, for example using chemical vapor deposition, to form a layer approximately 1000 Angstroms thick. This layer is then doped with phosphorus impurity to render it conductive. The polycrystalline silicon layer 95 provides the floating gate for the memory cells, and the control gate for transistors in the peripheral circuitry.

Figure 14:
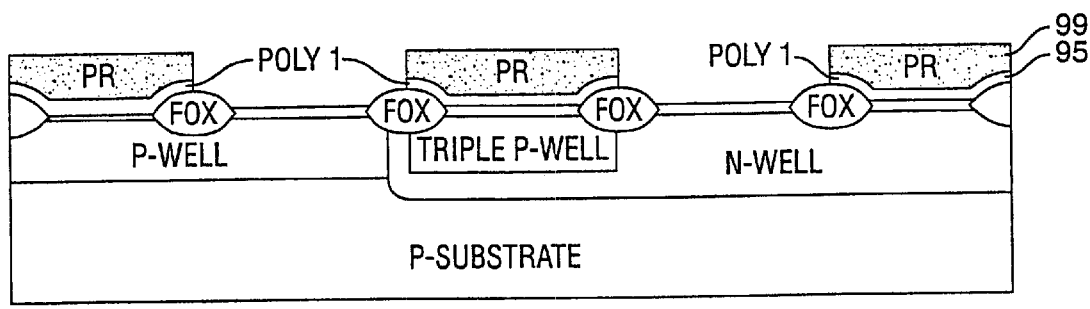

As next shown in FIG. 14, another mask 99, preferably photoresist, is formed across the structure to mask desired regions of the polycrystalline silicon 95 which are to remain on the structure. The thereby-exposed polycrystalline silicon 95 is etched from the surface of the structure, for example, using well known plasma etching or anisotropic etching processes. After the etching is complete, the appearance of the structure is as depicted in FIG. 14.

Figure 15:
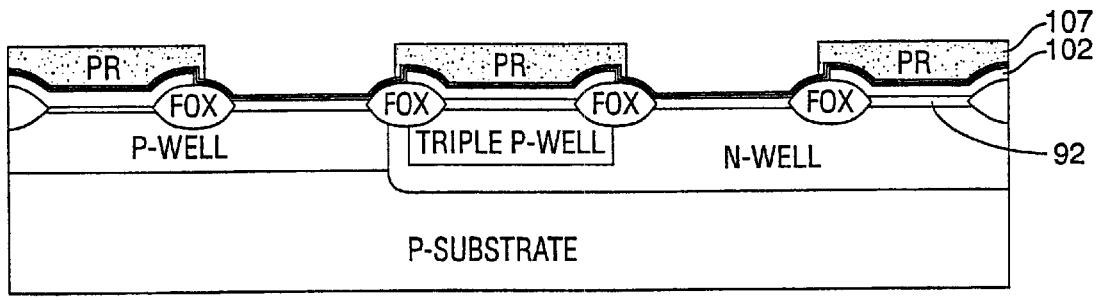

FIG. 15 illustrates the next steps in the manufacturing process. The photoresist layer 99 is stripped, and then a sequential deposition of silicon dioxide, silicon nitride, and silicon dioxide is performed to create an "ONO sandwich" composite insulating layer 102 which is on top of the polycrystalline silicon 95 in those regions where polycrystalline silicon layer 95 was formed and is on top of the thick gate oxide 92 in the other regions of the circuit. Preferably, the ONO layer is deposited using chemical vapor deposition; however, other well known techniques may be employed. Preferably, the ONO layer comprises 50 Angstroms of lower silicon dioxide, 60 Angstroms of intermediate silicon nitride, and 50 Angstroms of upper silicon dioxide. After formation of the ONO layer, a new masking layer 107 is deposited and defined to protect those regions where the polycrystalline silicon layer 95 remains.

Figure 16:
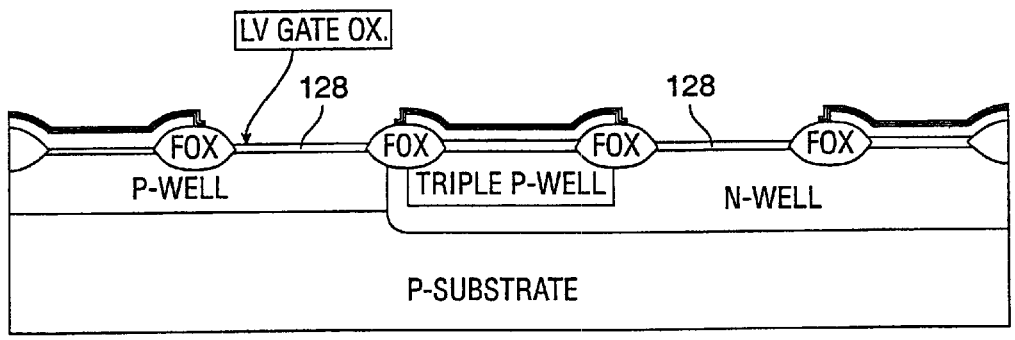

After formation of the mask 107 and as shown in FIG. 16, the exposed regions of the ONO sandwich structure are removed, using conventional etching procedures. This step removes the ONO composite layer, and also removes the thick gate oxide layer 92 in the exposed regions. The photoresist is then stripped. A new gate oxide layer 128 is formed. This new gate oxide is thinner (approximately 110 Angstroms) and is formed where lower power P- and N-channel transistors are to be formed.

Figure 17:
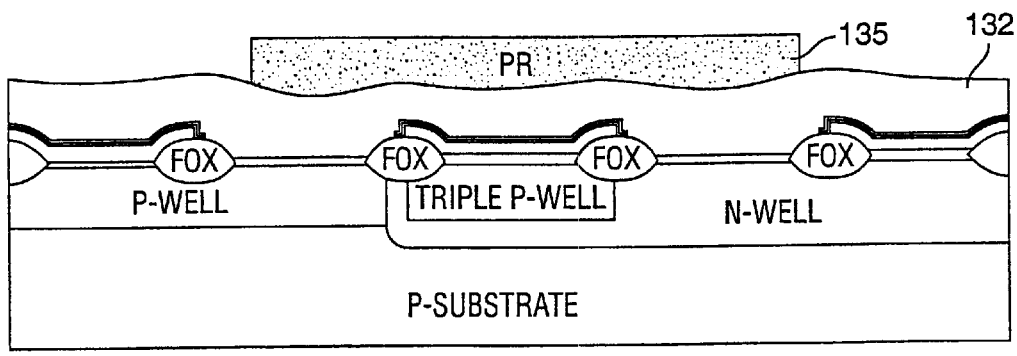
Figure 18:
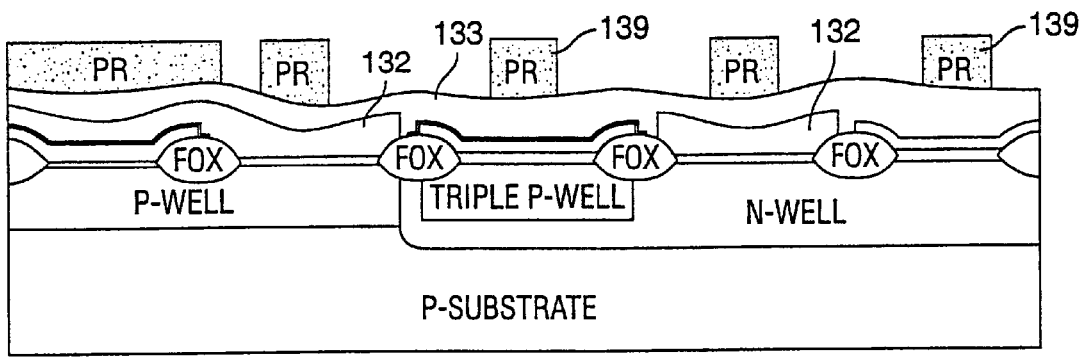
Figure 19:
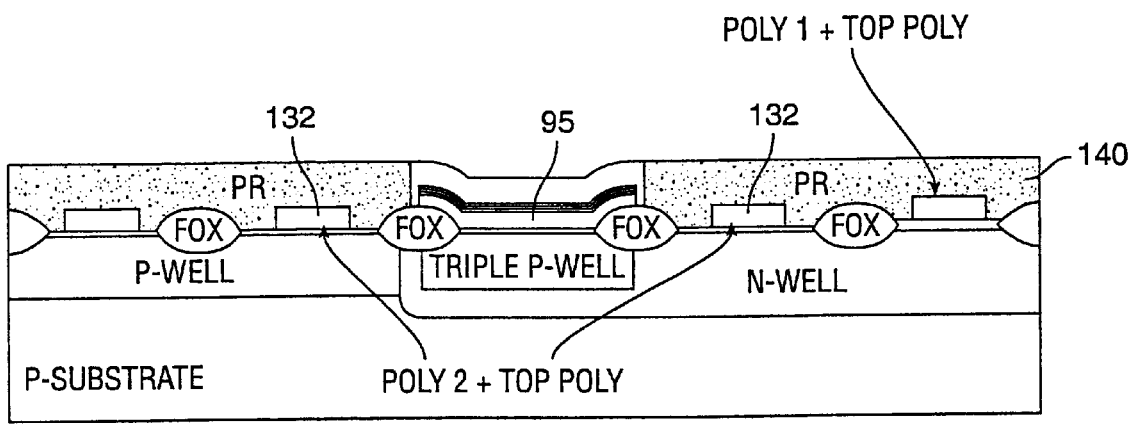

Then, as shown in FIG. 17 a second layer of polycrystalline silicon 132 is deposited across the surface of the structure. Preferably, polycrystalline silicon 132 will be 1000 Angstroms thick, and is deposited using conventional chemical vapor deposition process technology. Following the deposition of the polycrystalline silicon 132, it is doped with phosphorus impurity using a $POCl_3$ process. This "poly 2" layer will provide interconnections in the circuit. The second layer of polysilicon can be used to provide interconnections to the first layer of polysilicon in peripheral regions of the circuit. It can also provide a capacitor or be used for other connections in the memory cell region. A mask 135 is then formed to selectively protect the second poly. As shown by FIG. 18, the polysilicon 132 is then etched to remove it from undesired locations on the structure. Then a layer of tungsten silicide 133 is deposited across the upper surface of the polycrystalline silicon 132. On the upper surface of the tungsten silicide, an antireflective coating (not shown) is deposited, enabling more accurate masking tolerances by minimizing reflections from the upper surface of the tungsten silicide. Finally, a mask 139 is formed across the upper surface of the structure to further define the regions of the structure where the second layer of polycrystalline silicon is to remain. In the cross-section section shown in the figures, these are the regions where gate electrodes are desired. Using mask 139, the second layer of polysilicon is etched. Then a new mask 140 (see FIG. 19) is formed to protect portions of the structure, and define control and floating gates in the poly 1 layer 95 (see FIG. 19).

Figure 20:
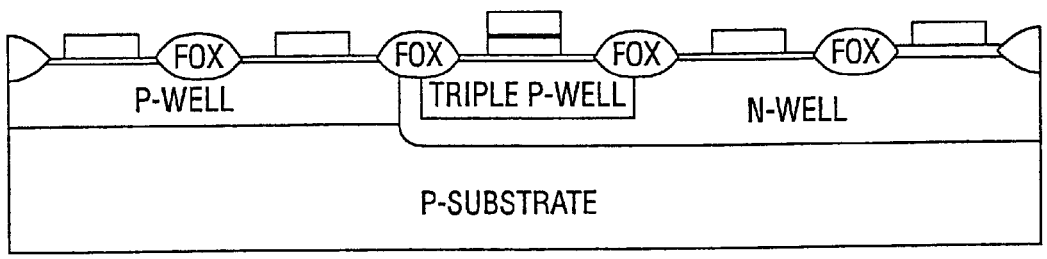

As shown by FIG. 20, the second layer of polycrystalline silicon 132 is then etched, again using conventional process technology. After etching the second layer of polycrystalline silicon 132, the polycrystalline silicon layer 132 is used as a mask to permit removal of exposed regions of the ONO sandwich layer. The ONO sandwich then functions as a mask for etching of the first level of polycrystalline silicon layer 95. In this manner, the memory cell gates are formed. After etching, the structure is reheated to again form a protective layer of oxide over the thereby exposed regions of silicon. Note that the memory cell transistor includes a floating gate and a control gate, while other transistors intended for use in peripheral circuitry do not.

Figure 21:
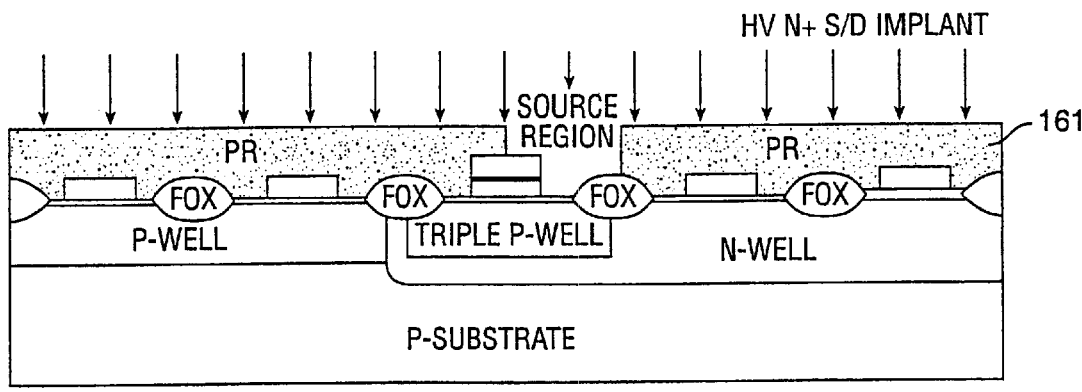

FIG. 21 illustrates the next steps in the process of fabrication. A mask 161 is formed across the surface of the structure to protect regions other than the source regions of the memory cell transistors. A double implant is then performed, with a first implant of N conductivity type impurity and a relatively low dose 3 E 14 $cm^{-2}$ and energy level 50 kev. A second implant at a higher concentration is performed following the first implant. These implants define the double-diffused source region concentration for the memory cells.

Figure 22:
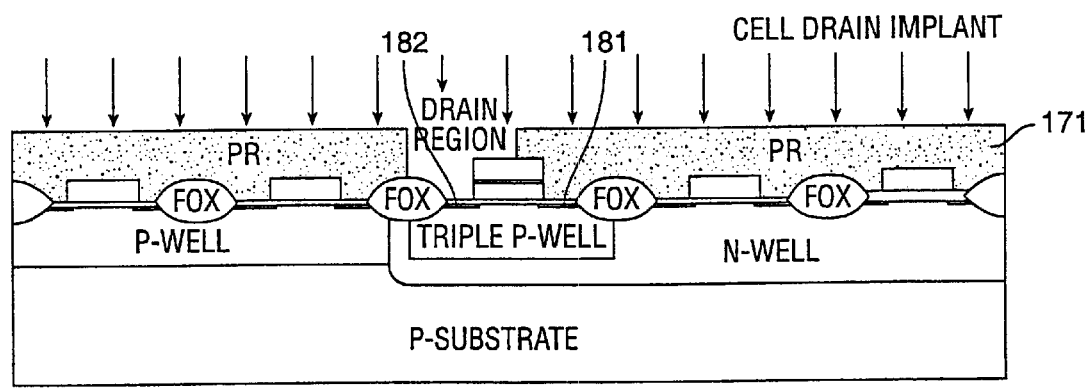

As shown in FIG. 22, all the photoresist is removed and a new mask 171 formed which exposes only the drain regions of the memory cells. Another implant is performed, this time of arsenic impurity at a concentration of 3.5 E 15 $cm^{-2}$ and an energy of 50 kev. FIG. 22 illustrates the resulting implanted drain regions.

Figure 23:
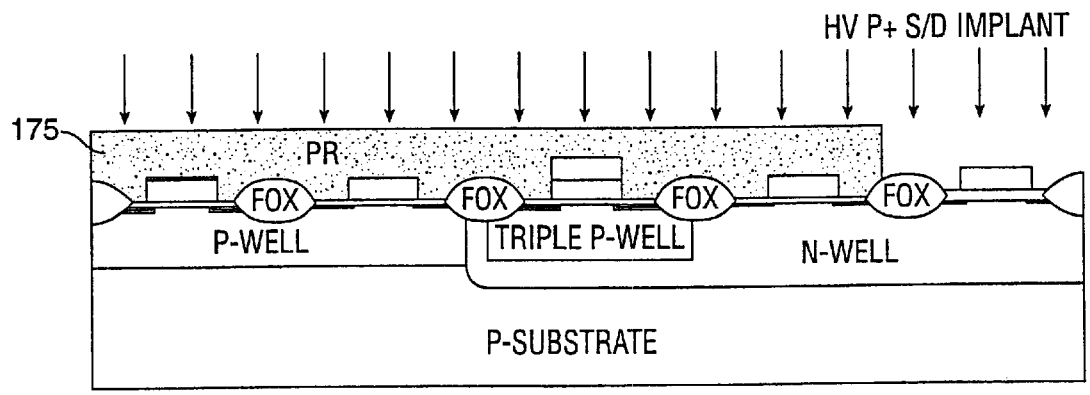
Figure 24:
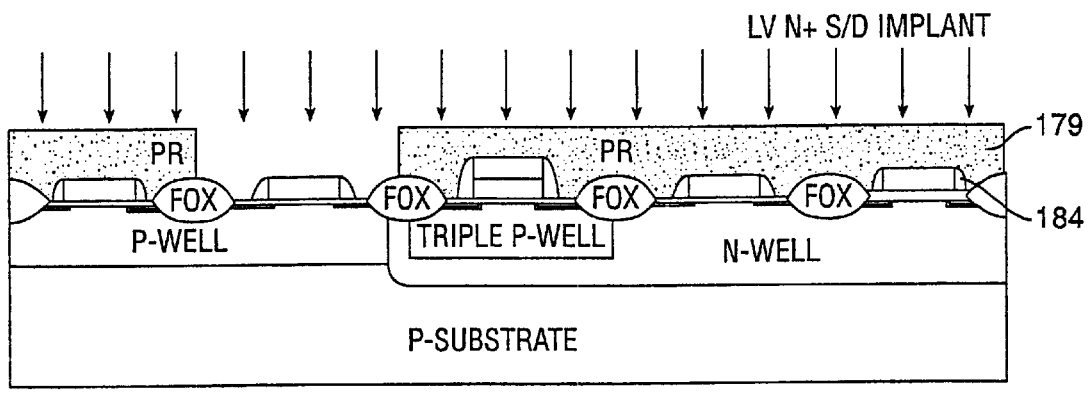
Figure 25:
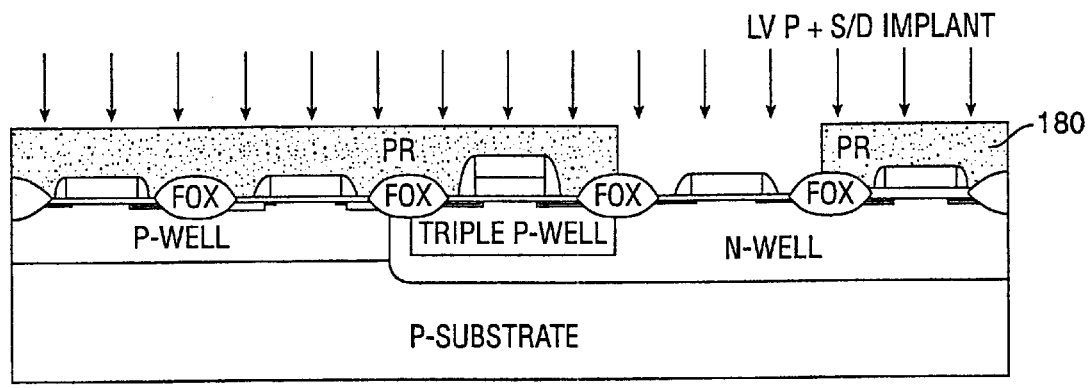

FIG. 23 shows a similar implant through masks 175 to form the source and drain regions for other transistors. The photoresist is removed and the structure is next heated to a temperature of 900° C. for 25 minutes to anneal the source drain implants. This results in the formation of the source and drain regions 181 and 182. The annealing operation also results in the formation of a silicon dioxide layer 184 over the polysilicon. Most of this layer is then removed using a blanket etch. By stopping the etch before all of the oxide is removed, spacer regions 184 remain on the sidewalls of the polycrystalline silicon gates. This enables formation of lightly doped drain structures. A new mask 175 is then formed to expose the peripheral transistors where more highly doped source/drains are desired; then an implant of 3.5 E 15 $cm^{-2}$ is performed as shown in FIG. 23.

Figure 26:
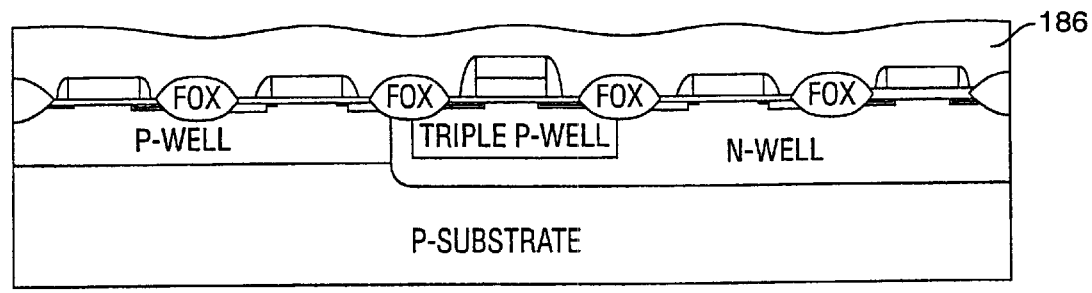

As shown by FIG. 26, following the annealing, a layer of silicon dioxide is deposited across the upper surface of the structure, followed by a layer of BPSG (boron phosphorous silicate glass) 186. The structure is then heated to generally planarize the layer of BPSG 186.

Figure 27:
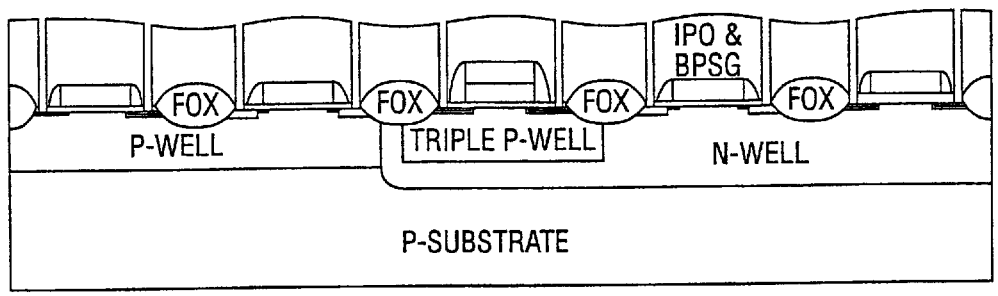
Figure 28:
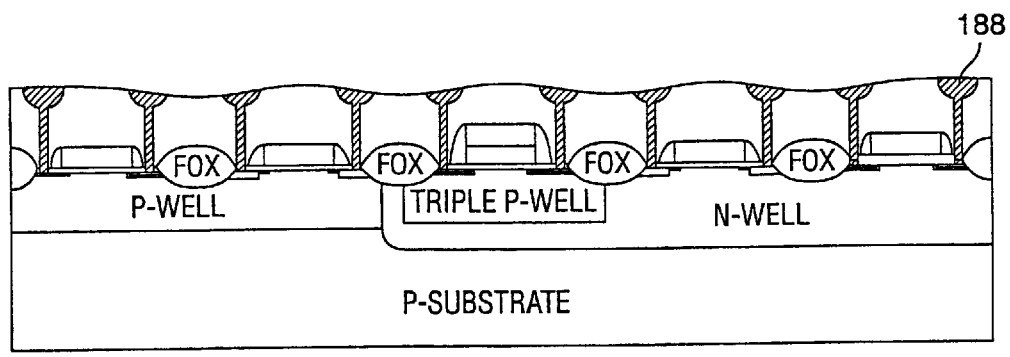
Figure 29:
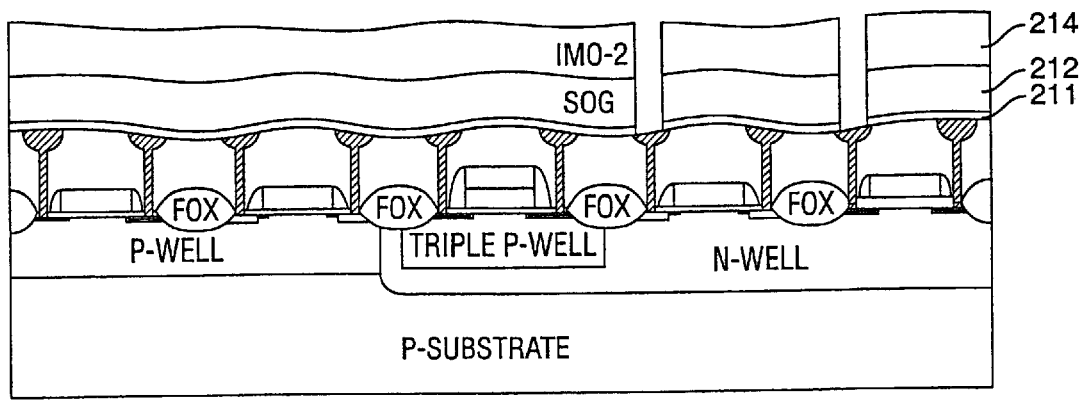

A mask, not shown, is formed across the upper surface of the BPSG, and the BPSG is etched as shown in FIG. 27 to define locations for contacts to the surface of the structure, as well as to other regions. Then in FIG. 28, a barrier metal, for example titanium/titanium nitride, is deposited into the openings in BPSG layer 186, followed by a deposition of the desired first layer metallization. The first layer metal is preferably aluminum. On the upper surface of the aluminum, a layer of titanium nitride is deposited to provide an antireflective coating. The first layer metal is then masked and etched, and the photoresist stripped. The remaining metal contacts 188 are shown in FIG. 28. Across the upper surface of the BPSG 186 and the metal contacts 188 is deposited an intermetal oxide, for example silicon oxide material, using chemical vapor deposition. IMO layer 211 is shown in FIG. 29. On top of the IMO layer, a spin-on glass coating 212 is deposited, and on its upper surface another intermetal oxide 214 is deposited. Preferably, layer 211 is approximately 1000 Angstroms thick, while layer 214 is approximately 2000 microns thick. A mask, not shown, is then formed across the upper surface of the second intermetal oxide. The mask is exposed and developed to create openings for etching of the layers 212 and 214. These layers are then etched, preferably using a plasma, to form openings for vias 217 to the first layer of metal. The photoresist is removed, and the appearance of the structure is depicted in FIG. 21.

Figure 30:
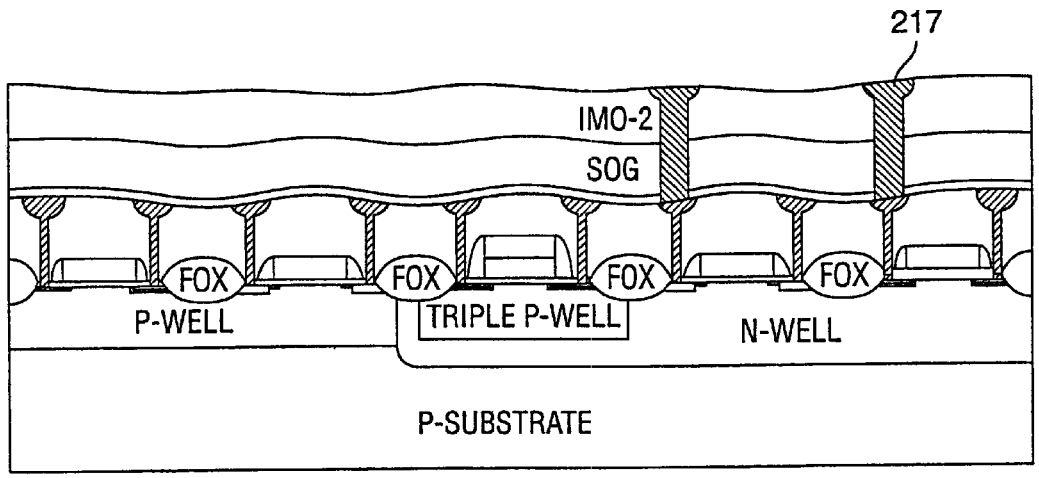

As shown by FIG. 30, another layer of metal, for example aluminum, is deposited across the upper surface of the chip to fill the via openings 217 and provide for the second metal layer. On its upper surface an antireflective titanium nitride coating is deposited, and then the second layer of metal is masked and etched, and the photoresist stripped, to create the structure depicted in FIG. 30.

Figure 31:
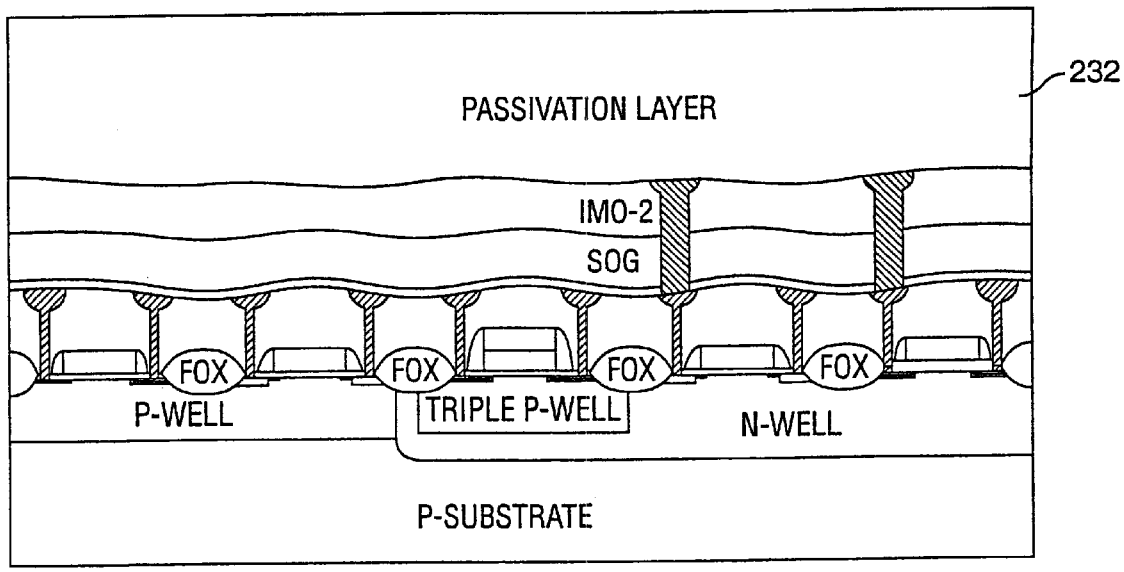

FIG. 31 illustrates the completed structure following the addition of a passivation layer 232 on the upper surface of the second layer of metal 221. The passivation layer is masked and etched, the photoresist stripped, and then the structure annealed in nitrogen to create the finished integrated circuit within a wafer.

Following this step, using well known semiconductor manufacturing operations, the resulting product can be tested, placed in packages and interconnected to the package, and then encapsulated.

The foregoing has been a description of the flash memory cell of our invention, as well as the process for fabricating it. Although it will be appreciated that numerous specific times, temperatures, and other process details have been provided, those of ordinary skill in the art will appreciate that numerous deviations may be made from the process, as well as the structure, without departing from the scope of the invention. The scope of the invention will be defined by the appended claims.

What is claimed is:

1. A method of programming an electrically programmable memory cell which cell includes a transistor formed in a semiconductor substrate of first conductivity type having a surface, a first well region of second conductivity type disposed in the substrate adjacent the surface thereof, a second well region of first conductivity type disposed in the first well region adjacent the surface, the transistor having a source region, a drain region, a floating gate, and a control gate, the method comprising:

raising the control gate to a first selected potential no greater than 9.0 volts;

raising the drain to a potential to no more than 5.0 volts;

coupling the source region to ground potential;

coupling the first well region of second conductivity type to ground potential; and placing the second well region at a potential below ground potential.

2. The programming method of claim 1, wherein the first selected potential is about 5–9 volts, inclusive.

3. The programming method of claim 2, wherein the first selected potential is about 6.5 volts.

4. The programming method of claim 1, wherein the potential of the drain is raised to about 3–5 volts, inclusive.

5. The programming method of claim 4, wherein the potential of the drain is raised to about 4.0 volts.

6. The programming method of claim 1, wherein the second well region is placed at a potential of about 0 volt to −4 volts, inclusive.

7. The programming method of claim 6, wherein the second well region is placed at a potential of about −2 volts to −4 volts, inclusive.

8. The programming method of claim 1, wherein the potential of the drain and the potential of the second well region are substantially the same in absolute value.

9. The programming method of claim 8 wherein the potential of drain is about 4 volts and the potential of the second well region is about −4 volts.

10. The programming method of claim 8, wherein the potential of the drain is about 1 volt greater than the potential of the second well region in the absolute value.

11. The programming method of claim 1, wherein the potential of the control gate is about 2–3 volts greater than the potential of the drain.

12. The programming method of claim 11, wherein the potential of the second well region is about 1 volt less than the potential of the drain in absolute value.

13. A method of programming an electrically programmable memory cell which cell includes a transistor formed in a region of semiconductor material, the transistor having a source region, a drain region, a floating gate, and a control gate, the method comprising:

raising the control gate to a first selected potential no greater than 9.0 volts;

raising the potential of the drain to no more than 5.0 volts;

placing the source region at a potential below ground potential; and placing the region of semiconductor material at a potential below ground potential.

14. The programming method of claim 13, wherein the control gate is raised to no greater than 5.0 volts.

15. The programming method of claim 14, wherein the drain is raised to no more than 1.0 volts.

16. A method of programming an electrically programmable memory cell which cell includes a transistor formed in a semiconductor substrate of first conductivity type having a surface, a first well region of second conductivity type disposed in the substrate adjacent the surface thereof, a second well region of first conductivity type disposed in the first well region adjacent the surface, the transistor having a source region, a drain region, a floating gate, and a control gate, the method comprising:

raising the control gate to a first selected potential no greater than 5.0 volts;

raising the potential of the drain to no more than 1.0 volts;

placing the source region at a potential below ground; and placing the second well region at a potential below ground potential.

17. The programming method of claim 16, the second well is placed at about −4 volts.

18. The programming method of claim 17, wherein the potential of the source region is about −4 volts.

19. The programming method of claim 16, wherein the source region and the second well have substantially the same potential.

20. The programming method of claim 19, further comprising:

placing the first well region at about 0 volt.

* * * * *

UNITED STATES PATENT AND TRADEMARK OFFICE
CERTIFICATE OF CORRECTION

PATENT NO. : 6,366,499 B1
DATED : April 2, 2002
INVENTOR(S) : Hsingya Arthur Wang, Jein-Chen Young and Ming-Sang Kwan It is certified that error appears in the above-identified patent and that said Letters Patent is hereby corrected as shown below:

<u>Title page,</u>
Item [75], Inventors, please correct inventor's names to read as -- Hsingya Arthur Wang, Saratoga; Jein-Chen Young, Milpitas; Ming-Sang Kwan, San Leandro, all of CA (US) --

Signed and Sealed this

Twenty-third Day of July, 2002

*Attest:*

JAMES E. ROGAN
*Attesting Officer*     *Director of the United States Patent and Trademark Office*